United States Patent [19]

Hoessel et al.

[11] Patent Number: 5,298,367
[45] Date of Patent: Mar. 29, 1994

[54] PRODUCTION OF MICROMOLDINGS HAVING A HIGH ASPECT RATIO

[75] Inventors: Peter Hoessel, Schifferstadt; Gerhard Hoffmann, Otterstadt; Thomas Wuensch, Bad Durkheim; Juergen Langen, Bonn, all of Fed. Rep. of Germany

[73] Assignee: BASF Aktiengesellschaft, Ludwigshafen, Fed. Rep. of Germany

[21] Appl. No.: 847,125

[22] Filed: Mar. 6, 1992

[51] Int. Cl.$^5$ .............................. G03F 7/30; G03C 5/16
[52] U.S. Cl. ................................... 430/326; 430/967; 430/324; 264/25
[58] Field of Search ................ 430/326, 967, 324; 264/25

[56] References Cited

U.S. PATENT DOCUMENTS

| | | |
|---|---|---|
| 3,884,696 | 5/1975 | Bowden et al. ............ 430/326 |
| 3,893,127 | 7/1975 | Kaplan et al. . |
| 4,150,989 | 4/1979 | Chambers et al. ............ 430/270 |
| 4,267,257 | 5/1981 | Poliniak et al. . |
| 4,289,845 | 9/1981 | Bowden et al. . |
| 4,397,938 | 8/1983 | Desai et al. ............ 430/326 |
| 4,398,001 | 8/1983 | Cheng et al. . |
| 4,409,317 | 10/1983 | Shiraishi . |
| 4,888,392 | 12/1989 | Matsuda et al. . |
| 5,066,566 | 11/1991 | Novembre ............ 430/967 |
| 5,112,707 | 5/1992 | Kato et al. ............ 430/5 |

FOREIGN PATENT DOCUMENTS 211161  6/1986  European Pat. Off. .

OTHER PUBLICATIONS

Methoden der organischen Chemi, vol. E20, Makromolekulare Stoffe, Part 2 (1987, 4th Edition, Georg Thieme Verlag, Stuttgart, p. 1468 ff. No Translation.

*Primary Examiner*—Marion E. McCamish
*Assistant Examiner*—Christopher D. RoDee
*Attorney, Agent, or Firm*—Keil & Weinkauf

[57] ABSTRACT

A process for the production of micromoldings having a high aspect ratio by imagewise irradiation of a polymer with high-energy, parallel radiation from an X-ray source employs, as the polymer, a copolymer comprising $SO_2$ and one or more ethylenically unsaturated organic compounds.

1 Claim, No Drawings

PRODUCTION OF MICROMOLDINGS HAVING A HIGH ASPECT RATIO

The invention relates to a process for the production of micromoldings having a high aspect ratio, i.e. having extremely large structure heights with lateral dimensions in the micron range, by irradiating polymers or polymer mixtures followed by development with suitable developer media.

The development of microelectronics has shown that the consequent miniaturization and integration has resulted in a confusing variety of new products with corresponding technologies. In a few years, microelectronics has achieved a considerable lead in miniaturization over other branches of industry. In the meantime, it is emerging that other microtechnologies will in the future also achieve considerable importance; mention should be made, in particular, of micromechanics and integrated optics. In combination with microelectronics, technologies of this type open up an unimaginable number of new electronic, optical, biological and mechanical function elements.

In mass production of nonelectronic assemblies, system components and subsystems of microtechnology, the extremely high-performance production methods of semiconductor technology are naturally utilized to a very considerable extent. At the same time, it must be attempted to update classical methods of precision engineering for micromechanics and to fuse them with appropriately modified semiconductor production methods in order to be able to leave the narrow confinements of silicon planar technology and to develop new design possibilities based on a wide range of shapes and materials. This requirement is satisfied, for example, to a considerable extent by the LIGA process, which is based on the production steps lithography,
electroforming and
casting and was developed at the Kernforschungszentrum Karlsruhe (KfK). It enables the production of microstructure elements having a high aspect ratio, i.e. having lateral dimensions in the micron range and structure heights of several hundred microns, from plastics, metals and ceramics.

The LIGA process is based on the concept of producing precise primary structures with a great structure height by a lithography process with a high depth sharpness and replicating these structures a number of times by one or more casting processes. This production concept is flexible and can be matched to the boundary conditions which are determined by the particular microstructure product and relate, inter alia, to the geometry, the materials used or to the number of pieces and determine the type and sequence of the individual production steps.

A typical production sequence for the mass production of microstructure elements of metal by the LIGA process contains a plurality of process steps.

In a first step, a polymer layer up to several hundred microns thick on an electroconductive substrate is irradiated through an X-ray mask with high intensity, parallel X-ray radiation generated as so-called synchrotron radiation in an electron synchrotron or an electron storage ring.

The irradiation increases the solubility of the polymer or polymer mixture in selected developer media to such an extent that the irradiated material areas can be removed, giving a relief-like polymer structure on the electroconductive substrate.

In the next production step, metal is electro-deposited on the substrate between the polymer structures, giving a metal structure which is complementary to the polymer relief. If the metal deposition is continued until the polymer structures are overgrown with a thick metal layer, a stable, coherent microstructure element comprising uniform material is obtained which can be used in the next process step as a mold insert for a casting process using plastic. Mass production of microstructure elements from plastic is thus possible.

The plastic structure produced may be the end product; alternatively, a template for a further electroforming step can be produced using a metallic feed plate. Templates of this type can again be produced in large number.

The production sequence described can be adapted to the requirements of specific microstructures, so that a wide variety of different microstructures can be produced. Interesting microstructure products are sensors for measuring acceleration, flow rate, ultrasound, humidity and the like, micromotors, micropneumatic components, microconnectors for microelectronics, microoptical components, fiber optics, microelectrodes, spinnerets, microfilters, sliding bearings, membranes and many others.

The essential production step of the LIGA process is the structure-accurate irradiation of the polymer employed. The feasibility of the LIGA process has been demonstrated by means of simple microstructures using a specially prepared polymethyl methacrylate (referred to as PMMA below).

In the conversion of complex three-dimensional structures, it has become apparent that PMMA requires a high radiation output.

It has furthermore been shown that, in the development of the irradiated polymer areas using a suitable developer medium, the nonirradiated areas swell, possibly destroying fine microstructures. On the other hand, swollen polymer areas may result in stress cracking on drying, which leads to unusable microstructure elements during electroforming. The cause of these problems is the high solvent sensitivity of PMMA.

It is an object of the present invention to find a polymer which has high X-ray sensitivity, depolymerizes on exposure to X-ray light, and may be selectively removable using specific developers; the polymer should furthermore facilitate simple sample production, for example by injection molding, pressing, extrusion or casting, and should not exhibit any swelling, stress cracking or defects.

We have found that, surprisingly, this object is achieved by polyalkene sulfones, i.e. copolymers comprising $SO_2$ and ethylenically unsaturated organic compounds.

Aliphatic polysulfones and their preparation have already been disclosed and are described, for example, in Houben-Weyl, Methoden der organischen Chemie, Volume E20, Makromolekulare Stoffe, Part 2 (1987, 4th Edition, Georg Thieme Verlag, Stuttgart), pages 1468 ff.

The use of polyalkene sulfones as solubility inhibitors for novolak matrices is described in U.S. Pat. No. 4,409,317, and their use as X-ray and electron resists is described in U.S. Pat. No. 4,888,392, EP-A-0,211,161, U.S. Pat. No. 4,409,317, U.S. Pat. No. 3,893,127, U.S.

Pat. No. 4,267,257, U.S. Pat. No. 4,289,845 and U.S. Pat. No. 4,398,001.

However, the layer thicknesses mentioned in these patent specifications and used for this purpose are generally only from a few tenths of a micron to a few microns. There is no mention that polyalkene sulfones can be used to produce micromoldings having a high aspect ratio, as is necessary for the LIGA process, and the resultant advantages were surprising and could not be deduced from these patent specifications.

The present invention accordingly provides a process for the production of micromoldings having a high aspect ratio by the imagewise irradiation of a polymer with high-energy, parallel radiation from an X-ray source, wherein the polymer employed is a copolymer comprising $SO_2$ and one or more ethylenically unsaturated organic compounds.

For the purposes of the present invention, micromoldings having a high aspect ratio are microstructure elements with structure depths of from several $\mu m$ up to the mm range.

The high-energy parallel radiation employed is preferably synchrotron radiation.

The application of the copolymer comprising $SO_2$ and one or more ethylenically unsaturated organic compounds to a base can be carried out by injection molding, extrusion, casting and/or pressing, preferably in a layer thickness of up to 2000 $\mu m$.

The present invention also provides a process for the production of microstructures, which comprises imagewise irradiation of the copolymer comprising $SO_2$ and one or more ethylenically unsaturated organic compounds using synchrotron radiation, exposing the irradiated polymer to the action of a selective developer, then structuring the polymer to a depth of from 50 $\mu m$ to 2000 $\mu m$ with lateral dimensions of less than 10 $\mu m$.

It was surprising that polyalkene sulfones, after exposure to synchrotron radiation through special masks and subsequent development steps using selective developer media such as i-propanol or mixtures of i-propanol and xylene (65:35) or methyl ethyl ketone and water (40:60), facilitate the production of microstructures having lateral dimensions of less than 10 $\mu m$ and maximum structure heights of up to several hundred microns. In contrast to PMMA, some of the material removal takes place as early as during irradiation with synchrotron radiation, without the action of specific developers (dry development). Surprisingly, these microstructure parts, in spite of the high layer thicknesses, have no defects due to gas evolution during irradiation. The synchrotron irradiation times necessary are significantly shorter than in the case of PMMA. An irradiation dose which allows a structure depth of only 50 $\mu m$ in the case of PMMA gives a development depth of up to 600 $\mu m$ here.

For the purposes of the present invention, the aspect ratio is the ratio between the height and the lateral dimension of the molding structures or of the relief or the ratio between the maximum structure height and the minimum lateral dimension. In the process according to the invention, the aspect ratio can be varied within broad limits, for example from 10:1 to 1000:1, preferably from 50:1 to 100:1.

In the process according to the invention, the irradiation is carried out using high-energy, parallel radiation from an X-ray source. The wavelength of this irradiation is in the range from 0.05 to 10 nm, preferably from 0.1 to 1 nm, in particular from 0.1 to 0.4 nm.

Irradiation of this type can be produced, for example, on a synchrotron using special preabsorbers, for example comprising beryllium and/or polyimide film (for example Kapton ® from Du Pont de Nemours) at an irradiation output of 200 to 2000 mA min.

The irradiation output depends on the electron energy in the electron storage ring which branches off from the synchrotron. In general, the electron energy is from 1.6 to 2.3 GeV.

The imagewise irradiation is usually carried out using special X-ray masks, for example a titanium base foil with gold absorber structures.

The polymer employed according to the invention is a copolymer comprising $SO_2$ and one or more ethylenically unsaturated organic compounds.

Copolymers of this type, which are also known as polyalkene sulfones, and their preparation are known, as stated above, and can be described, for example, by the formula

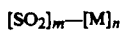

$$[SO_2]_m\text{---}[M]_n$$

where M are identical or different monomer units of ethylenically unsaturated organic compounds as the copolymerized constituent of the copolymer, and m and n are running numbers, where $m+n=50$ to 10,000 and $m=5$ to 50% of $m+n$, i.e. the copolymer can contain from 5 to 50 mol-% of $SO_2$.

M may be identical or different monomer units of the formula

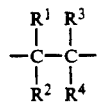

where $R^1$, $R^2$, $R^3$ and $R^4$ may be identical to or different from one another and are H, alkyl having 1 to 10 carbon atoms, or isoalkyl having 3 to 10 carbon atoms, or $R^2$ and $R^4$ are bonded together to form a 5- to 7-membered ring, M may alternatively be identical or different to monomer units of the formula

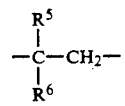

where
$R^5$ is phenyl or $C_1$–$C_4$-alkyl-substituted phenyl, and
$R^6$ is H or $CH_3$;
or M may be identical or different monomer units of the formula

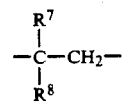

where
$R^7$ is H or $CH_3$, and
$R^8$ is

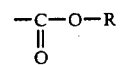

where R is alkyl having 1 to 10 carbon atoms or cycloalkyl having 5 to 7 carbon atoms.

Examples of ethylenically unsaturated compounds which can be copolymerized with SO₂ are olefins, such as ethylene, propylene, 1-hexene and 2-methyl-1-pentene, cyclic olefins, such as cyclopentene, cyclohexene and norbornene, dienes, such as butadiene, isoprene and hexadiene, vinylaromatic compounds, such as styrene, methylstyrene and α-methylstyrene, vinyl compounds, such as acrylic acid derivatives (for example acrylic acid esters and acrylonitrile), acrolein, vinyl chloride and vinyl esters of monocarboxylic acids, for example vinyl acetate.

It is possible to use either a copolymer comprising SO₂ and one ethylenically unsaturated organic compound of the abovementioned type or a copolymer comprising SO₂ and a mixture of two, three or more ethylenically unsaturated organic compounds, it being possible for the ratio between the amounts of the ethylenically unsaturated organic compounds to be set within broad limits, for example in a ratio of from 1:100 to 100:1.

Preference is given to copolymers comprising SO₂ and one or more olefins, such as propene, 1-hexene, 2-methyl-1-pentene and/or styrene, containing from 5 to 50 mol-% of copolymerized SO₂.

Particular preference is given to copolymers and to terpolymers where m+n is from 100 to 1000 and m is from 45 to 50%, for

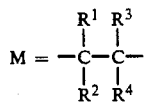

where
R¹ and R³ are H and R² and R⁴ are alkyl having 1 to 5 carbon atoms, and copolymers where m+n is from 100 to 1000 and m is from 10 to 50%, for

phenyl

Very particular preference is given to the copolymers

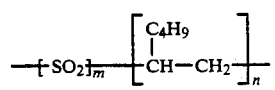

Poly-1-hexene sulfone

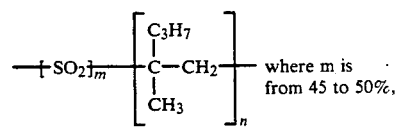

Poly-2-methyl-1-pentene sulfone

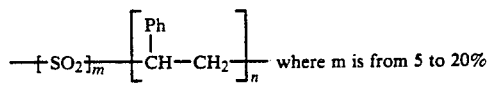

Polystyrene sulfone and the terpolymers

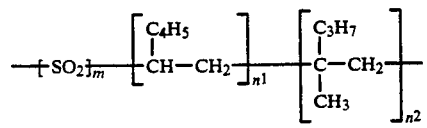

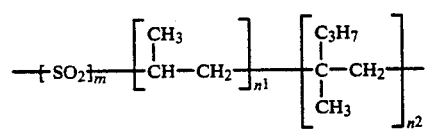

where m is from 45 to 50% and n¹ is from 5 to 50% and n² is from 5 to 45%.

In order to produce moldings, a copolymer comprising SO₂ and ethylenically unsaturated organic compounds, as granules or in powder form, can be applied to and fixed on a metal substrate, for example steel, copper or aluminum, by conventional processes, for example by pressing, injection molding and/or extrusion, at from 20° to 180° C. or by casting from a solution of the copolymer, if necessary with the additional use of special adhesive coatings or adhesion promoters. The thickness of the copolymer layer on the metal substrate is generally from 20 to 2000 μm, preferably from 50 to 1000 μm, in particular from 100 to 500 μm. The surface of the copolymer layer should expediently be very smooth.

After imagewise irradiation, development is carried out using suitable developer media, i.e. suitable organic solvents, such as isopropanol, or mixtures of organic solvents, such as i-propanol/xylene (e.g. 65:35) or methyl ethyl ketone/water (40:60), or the developers described, for example, in EP-A-0 211 161 and U.S. Pat. No. 3,893,127. Development depths of up to 600 μm are achieved in this way. The resultant microstructures have sharp, steep edges and are resistant to the electroplating baths, e.g. copper or nickel baths. The microstructures remain unchanged after 24 hours in an electroplating bath at from 20° to 60° C.

In the Examples, parts and percentages are by weight, unless stated otherwise.

EXAMPLES

Example 1

A copolymer ($\overline{M}_w$=500,000) comprising SO₂ units (50 mol-%) and 2-methyl-1-pentene units (50 mol-%) was applied to a metal plate by pressing at 100° C. The layer thickness was 600 μm.

The irradiation was carried out on a synchrotron at an irradiation output of 1600 mA.min using customary X-ray masks. Structuring took place even during the irradiation. Residues of degradation products in the irradiated areas were removed using i-propanol at 23° C. The polymer was removed completely down to the base (depth 600 microns). The microstructures had the required precision, dimensional stability and edge steepness.

Example 2

A terpolymer comprising $SO_2$ (50 mol-%), 1-hexene (25 mol-%) and 2-methyl-1-pentene (25 mol-%) was applied to a metal substrate by pressing at 120° C. The layer thickness was 600 μm.

The irradiation was carried out on a synchrotron at an irradiation output of 1600 mA.min using customary X-ray masks. After development for 10 minutes at 23° C. using a mixture of 65% by volume of i-propanol and 35% by volume of xylene, a development depth of 520 microns was achieved. The microstructures had the required precision, dimensional stability and edge steepness.

Example 3

A copolymer ($\overline{M}_w = 500,000$) comprising $SO_2$ (10 mol-%) and styrene (90 mol-%) was applied to a metal substrate by injection molding at 220° C. The layer thickness was 600 μm.

The irradiation was carried out on a synchrotron at an irradiation output of 1600 mA.min using customary X-ray masks. After development for 10 minutes at 23° C. using a mixture of 40% by volume of methyl ethyl ketone and 60% by volume of xylene, a development depth of 200 microns was achieved. The microstructures had the required precision, dimensional stability and edge steepness.

Comparison Example

The copolymers according to the invention were replaced by polymethyl methacrylate, which was irradiated imagewise as determined in Example 1.

At an irradiation output of 1600 mA.min and development using a developer comprising 60% by volume of butyl diglycol, 20% by volume of morpholine, 15% by volume of water and 5% by volume of 2-aminoethanol at 35° C. for 10 minutes, a development depth of only 50 μm is obtained.

We claim:

1. A process for the production of microstructures which comprises:

imagewise irradiating with high-energy, parallel X-ray radiation from a synchrotron, a copolymer of the formula $[SO_2]_m[M]_n$ prepared by reacting $SO_2$ and one or more ethylenically unsaturated organic compounds where M are identical or different polymerized monomer units of ethylenically unsaturated organic compounds as the copolymerized constituent of the copolymer and m and n are integers, where m+n=50 to 10,000 and m=5 to 50% of m+n, and M is identical or different polymerized units of the formula

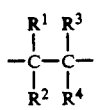

where $R^1$, $R^2$, $R^3$ and $R^4$ may be identical or different and are H, alkyl having 1 to 10 carbon atoms, or isoalkyl having 3 to 10 carbon atoms, or $R^2$ and $R^4$ are bonded together to form a 5- to 7-membered ring, and exposing the irradiated co-polymer to the action of a selective developer, thereby structuring the copolymer to a depth of from 50 μm to 1000 μm with lateral dimensions of less than 10 μm.

* * * * *

UNITED STATES PATENT AND TRADEMARK OFFICE
CERTIFICATE OF CORRECTION

PATENT NO. : 5,298,367
DATED : March 29, 1994
INVENTOR(S) : HOESSEL et al.

It is certified that error appears in the above-indentified patent and that said Letters Patent is hereby corrected as shown below:

On the cover page, insert the following foreign priority information:

[30] —Foreign Application Priority Data
Mar. 9, 1991 [DE] Fed. Rep. of Germany 4107662—

Signed and Sealed this

Thirty-first Day of January, 1995

Attest:

BRUCE LEHMAN

Attesting Officer     Commissioner of Patents and Trademarks